(12) United States Patent
Thyagarajan et al.

(10) Patent No.: US 11,631,439 B1
(45) Date of Patent: Apr. 18, 2023

(54) FLEXIBLE SIZING AND ROUTING ARCHITECTURE

(71) Applicant: Arm Limited, Cambridge (GB)

(72) Inventors: Sriram Thyagarajan, Austin, TX (US); Yew Keong Chong, Austin, TX (US); Munish Kumar, Noida (IN); Andy Wangkun Chen, Austin, TX (US); Rajiv Kumar Sisodia, Bangalore (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/515,258

(22) Filed: Oct. 29, 2021

(51) Int. Cl.
  *G11C 7/00* (2006.01)
  *G11C 7/06* (2006.01)
  *G11C 7/10* (2006.01)
  *G11C 5/06* (2006.01)

(52) U.S. Cl.
  CPC .......... *G11C 7/06* (2013.01); *G11C 5/06* (2013.01); *G11C 7/1069* (2013.01); *G11C 7/1096* (2013.01)

(58) Field of Classification Search
  CPC .......... G11C 7/06
  USPC .......... 365/189.14
  See application file for complete search history.

(56) References Cited

U.S. PATENT DOCUMENTS

| | | | | |
|---|---|---|---|---|
| 5,027,324 A | * | 6/1991 | Seo | G11C 11/4091 365/194 |
| 6,058,052 A | * | 5/2000 | Steadman | G11C 29/846 365/205 |
| 2005/0104627 A1 | * | 5/2005 | Song | G11C 7/14 327/51 |
| 2019/0172526 A1 | * | 6/2019 | Noel | G11C 11/412 |

* cited by examiner

*Primary Examiner* — Hoai V Ho
(74) *Attorney, Agent, or Firm* — Pramudji Law Group PLLC; Ari Pramudji

(57) ABSTRACT

Various implementations described herein are directed to a device having memory control circuitry having global passgates and a read-write driver that provides a global read-write signal to the global passgates. The device may have sense amplifier circuitry with local-drivers and a sense amplifier driver that provides a sense amplifier enable signal to the local-drivers, wherein the local-drivers may include multiple buffers coupled to the sense amplifier driver in parallel.

20 Claims, 7 Drawing Sheets

FLEXIBLE SIZING AND ROUTING ARCHITECTURE

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuit designs, memory size continues to shrink, which typically causes increased capacitance, because circuit components are closer together. If local device size is kept too small, then slew on a global net can be better for wide-bit instances; however, the same smaller size can slow down performance of logic that the global net is driving for small-bit instances. Also, smaller local sense-amp-enable drivers can reduce access-time because the differential formed can be smaller, and the impact can be even more for some instances in a smaller-to-medium-sized bits range. Otherwise, if the local device size is kept too large, then slew on the global net can be deficient for wide-bit instances, and performance can slow down for wider instances, because the device load is substantial, which can further decrease performance for the wider instances. Thus, there exists a need to improve efficiency of sizing and routing designs that enhance performance targets in modern conventional circuitry.

BRIEF DESCRIPTION OF THE DRAWINGS

Implementations of various memory layout schemes and techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to memory circuitry having flexible sizing and routing architecture that utilizes various schemes and techniques for supporting memory related applications in physical circuit designs. Also, various applications related to area optimal physical memory layout designs may be used to improve area, performance and power in logic structures along with related physical circuit designs. Various schemes and techniques that are described herein may also provide for an area optimal circuit design that utilizes random access memory (RAM) circuits along with read-write drivers and sense amplifier drivers for supporting, driving and/or controlling RAM based circuitry including, e.g., dynamic RAM (DRAM), static RAM (SRAM) or similar types of memory.

Various implementations described herein refer to a novel and innovative way to route critical signals and also size devices in memory columns so as to improve performance and power for different memory instance sizes. Some issues related to performance and/or power for a memory instance (or memory macro) may be dependent on the manner in which the critical global signals (e.g., bitline-precharge, write-mux select, read-mux select, sense-amp enable, sense-amp-precharge, write-clock) in the data-path (column section of memory macro) are routed. With increase in bits (size), the capacitive load on these signals increases because of the wire-load as well as the device load. Also, the resistance increases with more bits. Other issues related to performance and/or power may refer to device size of the local drivers in each repeating column-tile. For instance, in reference to higher sized devices, the capacitive load may increase with increasing bits, and also, the slew of these global signals may be dependent on the above two factors with increasing bits. In some advanced nodes, as metal pitch continues to shrink, capacitance/resistance continues to increase. Therefore, the present disclosure provides for routing critical signals and sizing devices in memory so as to improve performance and power in various memory applications.

Various implementations of providing flexible sizing and routing architecture will be described herein with reference to FIGS. 1-7.

Figure 1:
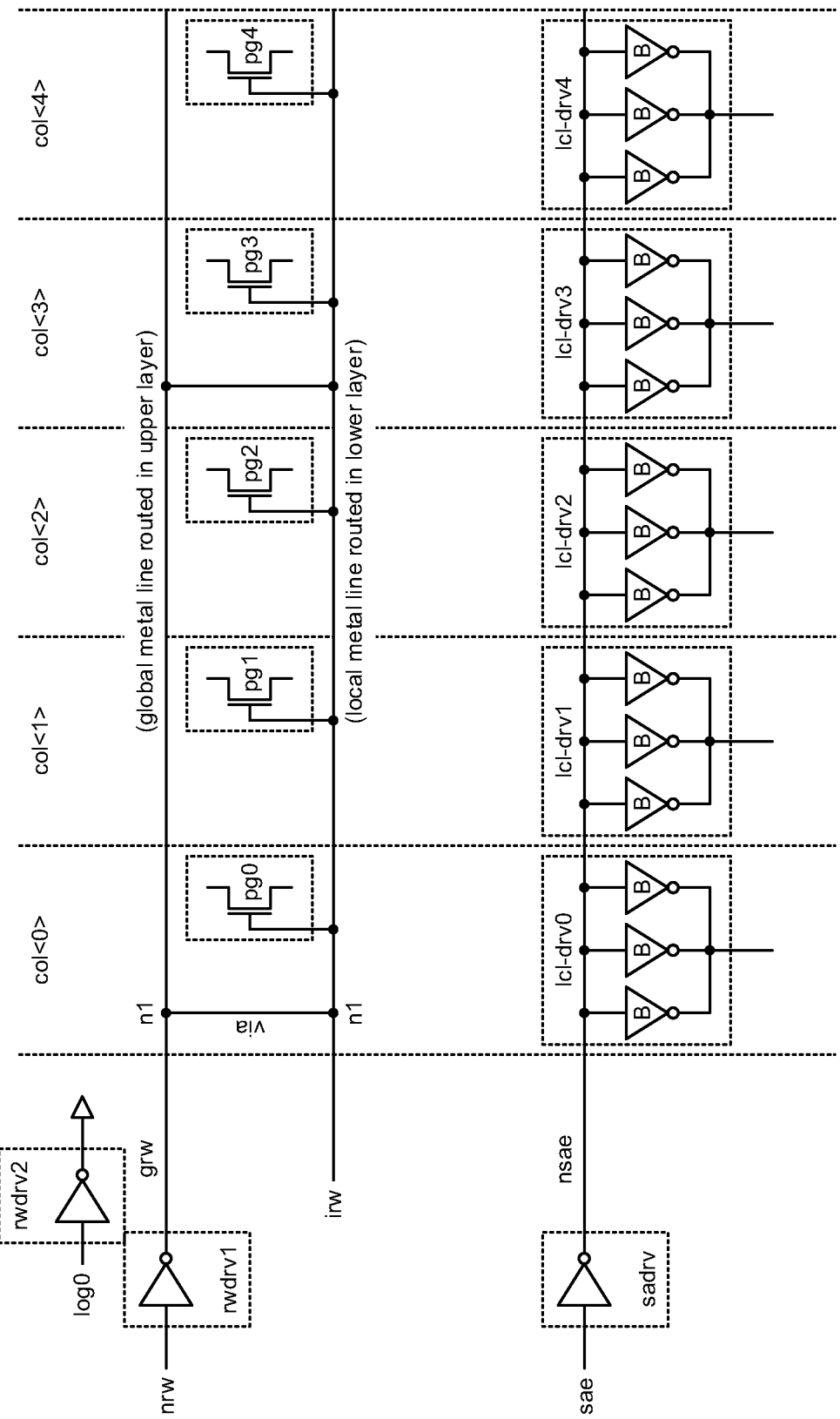
FIG. 1 illustrates a schematic diagram of flexible sizing and routing architecture in a first configuration in accordance with various implementations described herein.

FIG. 1 illustrates a diagram 100 of flexible sizing and routing architecture 104 in a first configuration in accordance with various implementations described herein.

In various implementations, the flexible sizing and routing architecture 104 may be implemented as a system or a device having various integrated circuit (IC) components that are arranged and coupled together as an assemblage or a combination of parts that provide for physical circuit designs and related structures. In some instances, a method of designing, providing, fabricating and/or manufacturing the flexible sizing and routing architecture 104 as an integrated system or device may involve use of various IC circuit components described herein so as to implement various related fabrication schemes and techniques associated therewith. In addition, the flexible sizing and routing architecture 104 may be integrated with various computing circuitry and components on a single chip, and further, the flexible sizing and routing architecture 104 may be implemented and/or incorporated in various types of embedded systems for automotive, electronic, mobile phone, server and Internet-of-things (IoT) applications, including remote sensor nodes.

As shown in FIG. 1, the flexible sizing and routing architecture 104 may refer to a logic based structure having memory control circuitry with global passgates (pg0, pg1, pg2, pg3, pg4, pg5) and a read-write driver (rwdrv1) that provides a global read-write signal (grw) to the global passgates (pg0, pg1, pg2, pg3, pg4, pg5). Also, the flexible sizing and routing architecture 104 may have sense amplifier circuitry with local-drivers (lcl-drv0, lcl-drv1, lcl-drv2, lcl-drv3, lcl-drv4, lcl-drv5) and a sense amplifier driver (sadrv) that may provide a sense amplifier enable signal (nsae) to the local-drivers (lcl-drv0, lcl-drv1, lcl-drv2, lcl-drv3, lcl-drv4, lcl-drv5). Further, the local-drivers (lcl-drv0, lcl-drv1, lcl-drv2, lcl-drv3, lcl-drv4, lcl-drv5) may have multiple buffers (B) coupled to the sense amplifier driver (sadrv) in parallel.

In some implementations, the global passgates (pg0, pg1, pg2, pg3, pg4, pg5) may be arranged in columns (col<0>, col<1>, col<2>, col<3>, col<4>), wherein each column of the columns (col<0>, col<1>, col<2>, col<3>, col<4>) has a corresponding global passgate of the global passgates (pg0, pg1, pg2, pg3, pg4, pg5). Also, the read-write driver (rwdrv1) may provide the global read-write signal (grw) to each global passgate (pg0, pg1, pg2, pg3, pg4, pg5) in each column (col<0>, col<1>, col<2>, col<3>, col<4>). In some instances, the read-write driver (rwdrv1) may refer to a first read-write driver (rwdrv1), and the architecture 104 may have a second read-write driver (rwdrv2) that is coupled between a grounded input signal (log 0) and grounded output (VSS or GND).

In some implementations, the flexible sizing and routing architecture 104 (i.e., the memory control circuitry) may be provided in a multi-layered structure having a first layer and a second layer that is disposed above the first layer. Also, the global passgates (pg0, pg1, pg2, pg3, pg4, pg5) may be disposed in the first layer that is disposed in a lower layer beneath the second layer. Also, the read-write driver (rwdrv1) may be coupled to the global passgates (pg0, pg1, pg2, pg3, pg4, pg5) with a metal line (e.g., global metal line (grw)) routed in the second layer that is disposed in a higher layer above the first layer. Moreover, the read-write driver (rwdrv1) may also be coupled to the global passgates (pg0, pg1, pg2, pg3, pg4, pg5) with another metal line (e.g., local metal line (irw)) routed in the first layer that is disposed in a lower layer below the second layer. In some instances, the global metal line (grw) may be coupled to the local metal line (irw) with a via coupled at node (n1).

In some implementations, the read-write driver (rwdrv1) may refer to a buffer or an inverter configured to receive an input read-write signal (nrw) and provide the global read-write signal (grw). Also, in some instances, the sense amplifier driver (sadrv) may refer to a buffer or an inverter configured to receive an input sense amplifier signal (sae) and provide the sense amplifier enable signal (nsae). Also, in some instances, the sense amplifier driver (sadrv) and/or the local drivers (lcl-drv0, lcl-drv1, lcl-drv2, lcl-drv3, lcl-drv4, lcl-drv5) may be disposed in the first layer that is disposed in a lower layer beneath the second layer. Further, the global passgates (pg0, pg1, pg2, pg3, pg4, pg5) may refer to read-write passgates, and the read-write passgates may refer to N-type transistors (e.g., NMOS transistors). However, in other instances, the read-write passgates may refer to P-type transistors (e.g., PMOS transistors). In addition, in some instances, the read-write driver (rwdrv1) may provide the global read-write signal (gnw) to a gate of each read-write passgate.

In some implementations, the local-drivers (lcl-drv0, lcl-drv1, lcl-drv2, lcl-drv3, lcl-drv4, lcl-drv5) may be arranged in the columns (col<0>, col<1>, col<2>, col<3>, col<4>), and each column of the columns (col<0>, col<1>, col<2>, col<3>, col<4>) may have a local-driver of the local-drivers. Also, the sense amplifier driver (sadrv) may provide the sense amplifier enable signal (nsae) to the local drivers (col<0>, col<1>, col<2>, col<3>, col<4>) in each column (col<0>, col<1>, col<2>, col<3>, col<4>).

In some implementations, the multiple buffers (B) of the local-drivers (lcl-drv0, lcl-drv1, lcl-drv2, lcl-drv3, lcl-drv4, lcl-drv5) may include two or more buffers (B) coupled to the sense amplifier driver (sadrv) in parallel. In other implementations, the multiple buffers (B) of the local-drivers (lcl-drv0, lcl-drv1, lcl-drv2, lcl-drv3, lcl-drv4, lcl-drv5) may include three or more buffers (B) coupled to the sense amplifier driver (sadrv) in parallel. In some instances, the local-drivers (lcl-drv0, lcl-drv1, lcl-drv2, lcl-drv3, lcl-drv4, lcl-drv5) may be associated with a variable repeat rate that depends on performance of the multiple buffers (B). Also, in some instances, the multiple buffers (B) may refer to multiple inverters, and the local-drivers (lcl-drv0, lcl-drv1, lcl-drv2, lcl-drv3, lcl-drv4, lcl-drv5) may include the multiple inverters coupled to the sense amplifier driver (sadrv) in parallel.

In some implementations, the architecture 104 may refer to a memory instance or memory circuitry that is implemented as an integrated circuit (IC) in various types of memory, such as RAM, static RAM (SRAM), magneto-resistive RAM (MRAM), and/or any other similar type of memory. Also, the memory instance may be implemented as an IC with single-port memory architecture and related circuitry, and the memory instance may be integrated with computing circuitry and related components on a single chip. The memory instance may be implemented in various embedded systems for various automotive, electronic, computer, mobile and/or Internet of things (IoT) applications. The memory instance may refer to a bitcell array with memory cells (or bitcells) arranged in an array, and each bitcell may be configured to store at least one data bit value (e.g., a data value related to a logical '0' or '1'). The bitcell array may also have any number (N) of bitcells arranged in various applicable configurations, such as a two-dimensional (2D) memory array having any number of columns (Ncolumns) and any number of rows (Nrows) with memory cells arranged in a 2D grid pattern.

Figure 2:
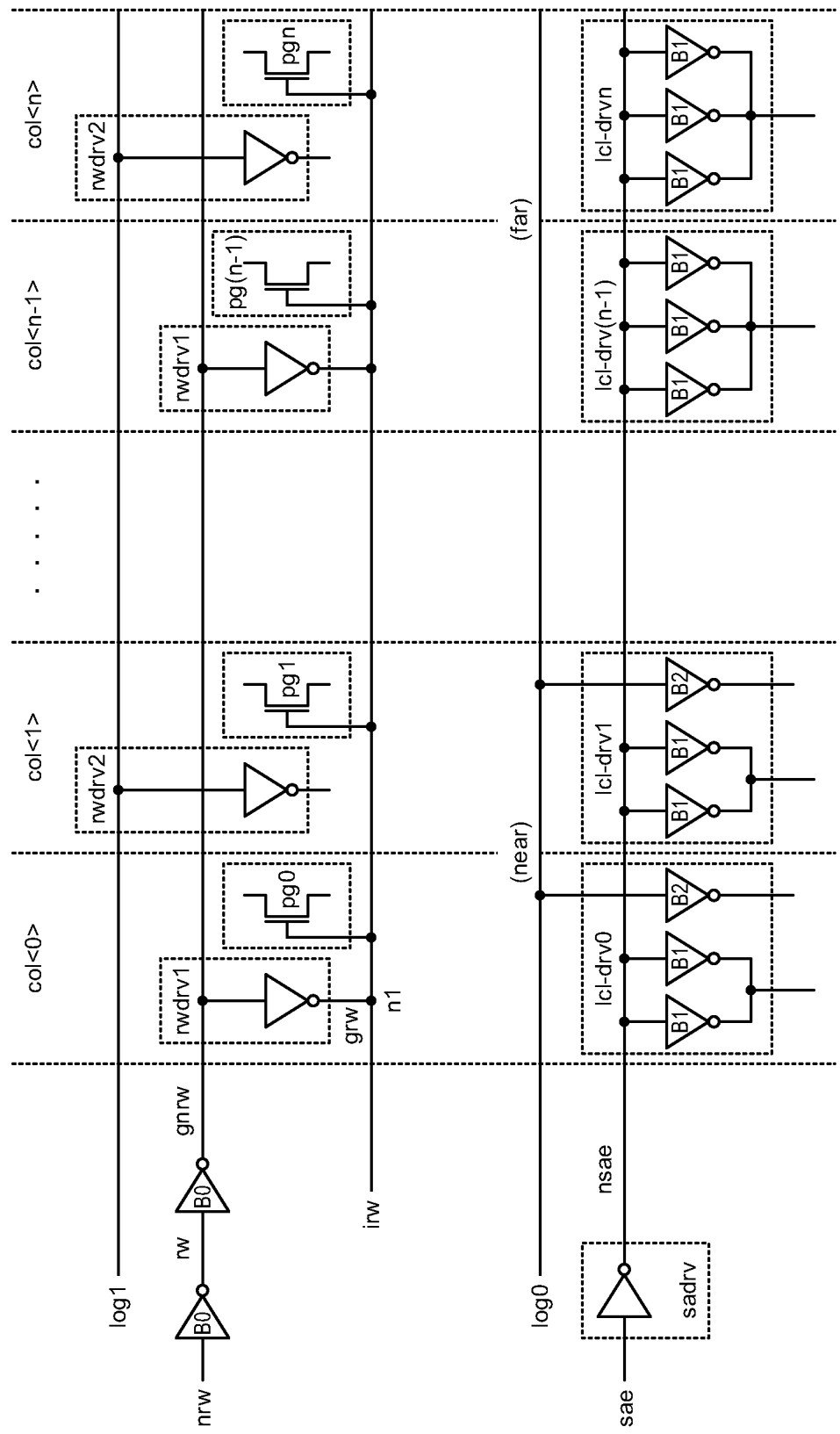
FIG. 2 illustrates a schematic diagram of flexible sizing and routing architecture in a second configuration in accordance with various implementations described herein.

FIG. 2 illustrates a diagram 200 of flexible sizing and routing architecture 204 in a second configuration in accordance with various implementations described herein. Also, the flexible sizing and routing architecture 204 in FIG. 2 may have similar features, circuits and/or components that are arranged, configured and/or operate in a similar manner as that shown in the flexible sizing and routing architecture 104 in FIG. 1. Certain portions may be repeated herein for purposes of completeness.

In various implementations, the flexible sizing and routing architecture 204 may be implemented as a system or a device having various integrated circuit (IC) components that are arranged and coupled together as an assemblage or a combination of parts that provide for physical circuit designs and related structures. In some instances, a method of designing, providing, fabricating and/or manufacturing the flexible sizing and routing architecture 204 as an integrated system or device may involve use of various IC circuit components described herein so as to implement various related fabrication schemes and techniques associated therewith. In addition, the flexible sizing and routing architecture 204 may be integrated with various computing circuitry and components on a single chip, and further, the flexible sizing and routing architecture 204 may be implemented and/or incorporated in various types of embedded systems for automotive, electronic, mobile phone, server and Internet-of-things (IoT) applications, including remote sensor nodes.

As shown in FIG. 2, the flexible sizing and routing architecture 204 may refer to a logic based structure having memory control circuitry with a number (n) of global passgates (pg0, pg1, . . . , pg(n−1), pgn) and a first read-write driver (rwdrv1) that provides a global read-write signal (grw) at node (n1) to the global passgates (pg0, pg1, . . . , pg(n−1), pgn). In some instances, the architecture 204 (or memory control circuitry) may include a second read-write driver (rwdrv2) that is tied-off to a first voltage, such as, e.g., a logic-one voltage (log 1). Also, the flexible sizing and routing architecture 204 may include sense amplifier circuitry with first local-drivers (B1 in lcl-drv0, lcl-drv1, . . . , lcl-drv(n−1), lcl-drvn) and the sense amplifier driver (sadrv) that provides the sense amplifier enable signal (nsae) to the first local-drivers (B1 in lcl-drv0, lcl-drv1, . . . , lcl-drv(n−1), lcl-drvn). In addition, the sense amplifier circuitry may have second local-drivers (B2) that are tied-off to a second voltage (log 0), which is different than the first voltage (log 1), wherein the second local-drivers (B2) are coupled to a grounded input signal (log 0), such as, e.g., logic-zero voltage (log 0, VSS, GND).

In some implementations, the global passgates (pg0, pg1, . . . , pg(n−1), pgn) and the local-drivers (B1 in lcl-drv0, lcl-drv1, . . . , lcl-drv(n−1), lcl-drvn) may be arranged in columns (col<0>, col<1>, . . . , col<n−1>, col<n>). Also, each column of the columns (col<0>, col<1>, . . . , col<n−1>, col<n>) may have a corresponding global passgate of the global passgates (pg0, pg1, . . . , pg(n−1), pgn) and a corresponding local-driver of the local-drivers (B1 in lcl-drv0, lcl-drv1, . . . , lcl-drv(n−1), lcl-drvn). Also, the first read-write driver (rwdrv1) may provide the global read-write signal (grw) to the global passgates (pg0, pg1, . . . , pg(n−1), pgn) in each column (col<0>, col<1>, . . . , col<n−1>, col<n>). Also, the sense amplifier driver (sadrv) may provide the sense amplifier enable signal (nsae) to the local-drivers (B1 in lcl-drv0, lcl-drv1, . . . , lcl-drv(n−1), lcl-drvn) in each column (col<0>, col<1>, . . . , col<n−1>, col<n>).

In some implementations, the architecture 204 (or memory control circuitry) may be provided in a multi-layered structure with a first layer and a second layer that is disposed above the first layer. The global passgates (pg0, pg1, . . . , pg(n−1), pgn) may be disposed in the first layer that is disposed in a lower layer beneath the second layer. The first read-write driver (rwdrv1) may be coupled to the global passgates (pg0, pg1, . . . , pg(n−1), pgn) with the global metal line (gnrw) routed in the second layer and the local metal line (lrw) routed in the first layer. As described herein, the second layer is disposed in a higher layer above the first layer, and as such, the first layer is disposed in a lower layer beneath the second layer. Also, the sense amplifier driver (sadrv) and the local drivers (B1/B2 in lcl-drv0, lcl-drv1, . . . , lcl-drv(n−1), lcl-drvn) in each column (col<0>, col<1>, . . . , col<n−1>, col<n>) may be disposed in the first layer that is disposed in a lower layer beneath the second layer.

In some implementations, the first read-write driver (rwdrv1) may refer to one or more buffers/inverters configured to receive the gnrw signal and provide the grw signal to the gate of each global passgate (pg0, pg1, . . . , pg(n−1), pgn). Also, the second read-write driver (rwdrv2) may refer to one or more buffers/inverters configured to receive the log 1 signal and provide the log 0 signal. Also, as shown in FIG. 2, the architecture 204 (or memory control circuitry) may include multiple input buffers (B0) coupled in series and configured to receive the nrw signal, provide the rw signal, and provide the gnrw signal. Also, in some instances, the sense amplifier driver (sadrv) may refer to a buffer or an inverter configured to receive an input sense amplifier signal (sae) and provide the sense amplifier enable signal (nsae). Also, the global passgates (pg0, pg1, . . . , pg(n−1), pgn) may refer to read-write passgates, and the read-write passgates may refer to N-type transistors (NMOS). However, in other instances, the read-write passgates may refer to P-type transistors (PMOS).

In various implementations, as shown in FIG. 2, the first local-drivers (B1 in lcl-drv0, lcl-drv1, . . . , lcl-drv(n−1), lcl-drvn) may have one or more buffers (B1) that are coupled to the sense amplifier driver (sadrv) in parallel. Also, in some instances, as further shown in FIG. 2, the second local-drivers (B2 in lcl-drv0, lcl-drv1, . . . , lcl-drv(n−1), lcl-drvn) may have at least one buffer (B2) that is tied-off to the second voltage (log 0). Also, in some instances, the one or more buffers (B1) may refer to one or more inverters, and the at least one buffer (B2) may refer to at least one inverter coupled to the log 0 signal.

In some implementations, as shown in FIG. 2, the first local buffers (B1 in lcl-drv0, lcl-drv1, . . . , lcl-drv(n−1), lcl-drvn) and the second local buffers (B2 in lcl-drv0, lcl-drv1, . . . , lcl-drv(n−1), lcl-drvn) may be grouped together in the columns (col<0>, col<1>, . . . , col<n−1>, col<n>) including a first group (e.g., B1/B2 in lcl-drv0, lcl-drv1) in near columns (e.g., col<0>, col<1>) and a second group (e.g., B1/B2 in lcl-drv(n−1), lcl-drvn) in far columns (e.g., col<n−1>, col<n>). In some instances, in the first group in near columns, the first local-drivers (B1 in lcl-drv0, lcl-drv1) may have multiple buffers (B1) coupled to the sense amplifier driver (sadrv), and the second local-drivers (B2 in lcl-drv0, lcl-drv1) may have at least one buffer (B2) tied-off to the second voltage (log 0). Also, in some instances, in the second group in far columns, the first local-drivers (B1 in lcl-drv(n−1), lcl-drvn) may have three or more buffers (B1) coupled to the sense amplifier driver (sadrv), and zero second local-drivers (e.g., no B2 buffers in lcl-drv(n−1), lcl-drvn).

Figure 3:
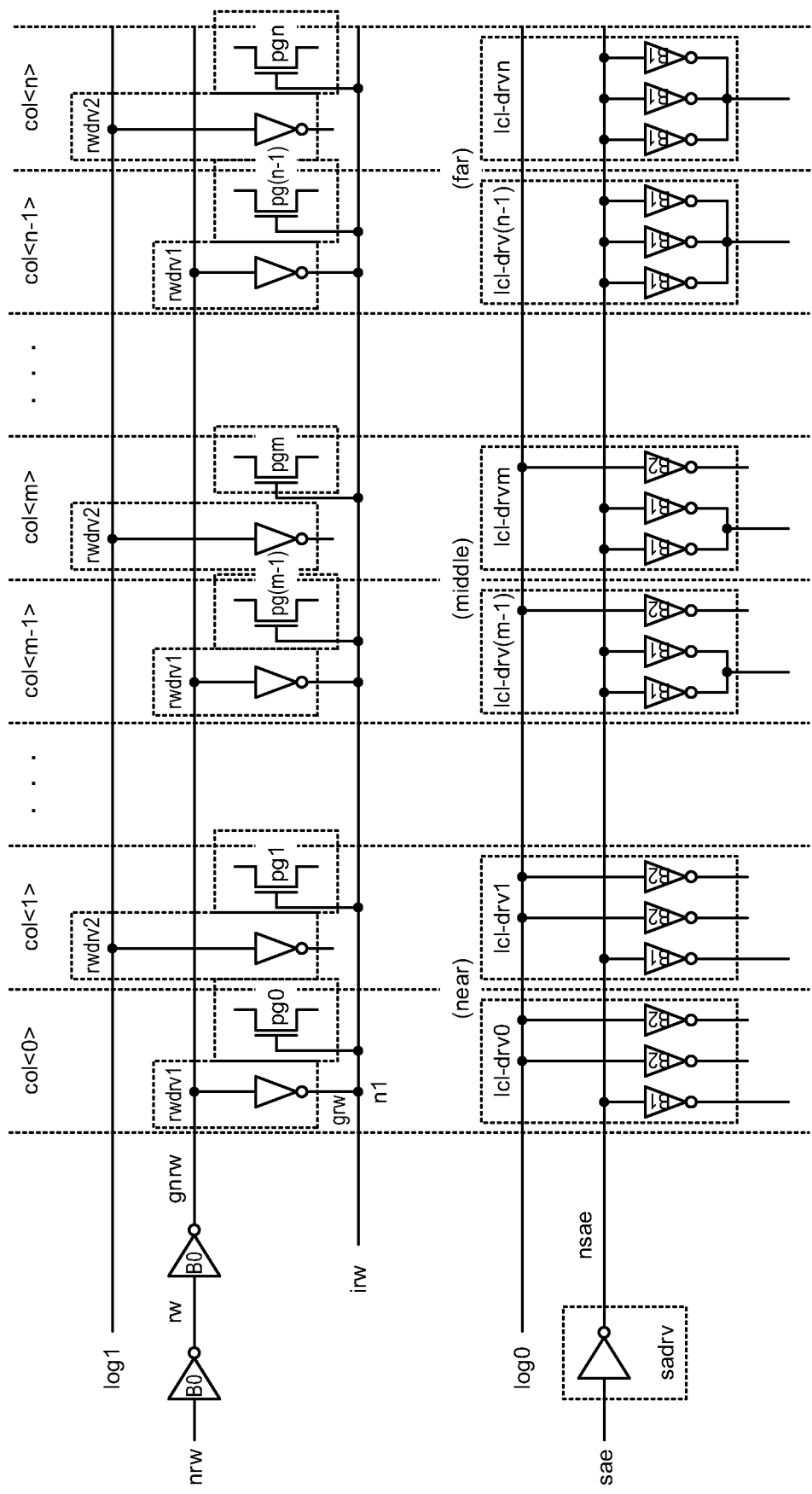
FIG. 3 illustrates a schematic diagram of flexible sizing and routing architecture in a third configuration in accordance with various implementations described herein.

FIG. 3 illustrates a diagram 300 of flexible sizing and routing architecture 304 in a third configuration in accordance with various implementations described herein. Also, the flexible sizing and routing architecture 304 in FIG. 3 may have similar features, circuits and/or components that are arranged, configured and/or operate in a similar manner as that shown in the flexible sizing and routing architecture 104, 204 in FIGS. 1-2. Certain portions may be repeated herein for purposes of completeness.

In various implementations, the flexible sizing and routing architecture 304 may be implemented as a system or a device having various integrated circuit (IC) components that are arranged and coupled together as an assemblage or a combination of parts that provide for physical circuit designs and related structures. In some instances, a method of designing, providing, fabricating and/or manufacturing the flexible sizing and routing architecture 304 as an integrated system or device may involve use of various IC circuit components described herein so as to implement various related fabrication schemes and techniques associated therewith. In addition, the flexible sizing and routing architecture 304 may be integrated with various computing circuitry and components on a single chip, and further, the flexible sizing and routing architecture 304 may be implemented and/or incorporated in various types of embedded systems for automotive, electronic, mobile phone, server and Internet-of-things (IoT) applications, including remote sensor nodes.

As shown in FIG. 3, the flexible sizing and routing architecture 304 may refer to a logic based structure having memory control circuitry with a number (n) of global passgates (pg0, pg1, . . . , pg(m−1), pgm, . . . , pg(n−1), pgn) and first read-write drivers (rwdrv1) that provide the global read-write signal (grw) at node (n1) to the global passgates (pg0, pg1, . . . , pg(m−1), pgm, . . . , pg(n−1), pgn). The architecture 304 (or memory control circuitry) may have second read-write drivers (rwdrv2) that are tied-off to the log 1 voltage. Also, the flexible sizing and routing architecture 304 may have sense amplifier circuitry with first local-drivers (B1 in lcl-drv0, lcl-drv1, . . . , lcl-drv(m−1), lcl-drvm, . . . , lcl-drv(n−1), lcl-drvn) and the sense amplifier driver (sadrv) that provides the sense amplifier enable signal (nsae) to the first local-drivers (B1 in lcl-drv0, lcl-drv1, . . . , lcl-drv(m−1), lcl-drvm, . . . , lcl-drv(n−1), lcl-drvn). The sense amplifier circuitry may also have second local-drivers (B2) that are tied-off to the log 0 voltage, wherein the second local-drivers (B2) are coupled to the grounded input signal (log 0), such as, e.g., logic-zero voltage (log 0, VSS, GND).

In some implementations, the global passgates (pg0, pg1, . . . , pg(m−1), pgm, . . . , pg(n−1), pgn) and the local-drivers (B1 in lcl-drv0, lcl-drv1, . . . , lcl-drv(m−1), lcl-drvm, . . . , lcl-drv(n−1), lcl-drvn) may be arranged in near/middle/far columns (col<0>, col<1>, . . . , col<m−1>, col<m>, . . . , col<n−1>, col<n>). Also, each column of the columns (col<0>, col<1>, . . . , col<m−1>, col<m>, . . . , col<n−1>, col<n>) may have a corresponding global passgate of the global passgates (pg0, pg1, . . . , pg(m−1), pgm, . . . , pg(n−1), pgn) and a corresponding local-driver of the local-drivers (B1 in lcl-drv0, lcl-drv1, . . . , lcl-drv(m−1), lcl-drvm, . . . , lcl-drv(n−1), lcl-drvn). Also, the first read-write drivers (rwdrv1) may provide the global read-write signal (grw) to the global passgates (pg0, pg1, . . . , pg(m−1), pgm, . . . , pg(n−1), pgn) in each column (col<0>, col<1>, . . . , col<m−1>, col<m>, . . . , col<n−1>, col<n>). The sense amplifier driver (sadrv) may provide the sense amplifier enable signal (nsae) to the local-drivers (B1 in lcl-drv0, lcl-drv1, . . . , lcl-drv(m−1), lcl-drvm, . . . , lcl-drv(n−1), lcl-drvn) in each column (col<0>, col<1>, . . . , col<m−1>, col<m>, . . . , col<n−1>, col<n>).

In some implementations, the architecture 304 (or memory control circuitry) may be provided in a multi-layered structure with a first layer and a second layer that is disposed above the first layer. The global passgates (pg0, pg1, . . . , pg(m−1), pgm, . . . , pg(n−1), pgn) may be disposed in the first layer that is disposed in a lower layer beneath the second layer. The first read-write driver (rwdrv1) may be coupled to the global passgates (pg0, pg1, . . . , pg(m−1), pgm, . . . , pg(n−1), pgn) with the global metal line (gnrw) routed in the second layer and the local metal line (irw) routed in the first layer. As described herein, the second layer is disposed in a higher layer above the first layer, and as such, the first layer is disposed in a lower layer beneath the second layer. Also, the sense amplifier driver (sadrv) and the local drivers (B1/B2 in lcl-drv0, lcl-drv1, . . . , lcl-drv(m−1), lcl-drvm, . . . , lcl-drv(n−1), lcl-drvn) in each column (col<0>, col<1>, . . . , col<m−1>, col<m>, . . . , col<n−1>, col<n>) may be disposed in the first layer that is disposed in a lower layer beneath the second layer.

In some implementations, the first read-write driver (rwdrv1) may refer to one or more buffers/inverters configured to receive the gnrw signal and provide the grw signal to the gate of each global passgate (pg0, pg1, . . . , pg(m−1), pgm, . . . , pg(n−1), pgn). The second read-write driver (rwdrv2) may refer to one or more buffers/inverters configured to receive the log 1 signal and provide the log 0 signal. Also, as shown in FIG. 3, the architecture 304 (or memory control circuitry) may include multiple input buffers (B0) coupled in series and configured to receive the nrw signal, provide the rw signal, and provide the gnrw signal. Also, the sense amplifier driver (sadrv) may refer to a buffer or an inverter configured to receive an input sense amplifier signal (sae) and provide the sense amplifier enable signal (nsae). Also, the global passgates (pg0, pg1, . . . , pg(m−1), pgm, . . . , pg(n−1), pgn) may refer to read-write passgates, and the read-write passgates may refer to N-type transistors (NMOS). However, in other instances, the read-write passgates may refer to P-type transistors (PMOS).

In various implementations, as shown in FIG. 3, the first local-drivers (B1 in lcl-drv0, lcl-drv1, . . . , lcl-drv(m−1), lcl-drvm, . . . , lcl-drv(n−1), lcl-drvn) may include one or more buffers (B1) that are coupled to the sense amplifier driver (sadrv) in parallel. Also, in some instances, as further shown in FIG. 3, the second local-drivers (B2 in lcl-drv0, lcl-drv1, . . . , lcl-drv(m−1), lcl-drvm, . . . , lcl-drv(n−1), lcl-drvn) may include zero to one or more buffers (B2) that are tied-off to the second voltage (log 0). Also, in some instances, the one or more buffers (B1) may refer to one or more inverters, and the one or more buffers (B2) may refer to at least one inverter coupled to the log 0 signal.

In some implementations, as shown in FIG. 3, the first local buffers (B1 in lcl-drv0, lcl-drv1, . . . , lcl-drv(m−1), lcl-drvm, . . . , lcl-drv(n−1), lcl-drvn) and the second local buffers (B2 in lcl-drv0, lcl-drv1, . . . , lcl-drv(m−1), lcl-drvm, . . . , lcl-drv(n−1), lcl-drvn) may be grouped together in the near/middle/far columns (col<0>, col<1>, . . . , col<m−1>, col<m>, . . . , col<n−1>, col<n>) including a first group (e.g., B1/B2 in lcl-drv0, lcl-drv1) in near columns (e.g., col<0>, col<1>), a second group (e.g., B1/B2 in lcl-drv(m−1), lcl-drvm) in middle columns (e.g., col<m−1>, col<m>), and a third group (e.g., B1/B2 in lcl-drv(n−1), lcl-drvn) in far columns (e.g., col<n−1>, col<n>). In some instances, in the first group in near columns, the first local-drivers (B1 in lcl-drv0, lcl-drv1) may have at least one buffer (B1) coupled to the sense amplifier driver (sadrv), and the second local-drivers (B2 in lcl-drv0, lcl-drv1) may have one or more buffers (B2) tied-off to the second voltage (log 0). Also, in some instances, in the second group in middle columns, the first local-drivers (B1 in lcl-drv(m−1), lcl-drvm) may have multiple buffers (B1) coupled to the sense amplifier driver (sadrv), and at least one second local-driver (e.g., no B2 buffers in lcl-drv(m−1), lcl-drvm). Moreover, in some instances, in the third group in far columns, the first local-drivers (B1 in lcl-drv(n−1), lcl-drvn) may have three or more buffers (B1) coupled to the sense amplifier driver (sadrv), and zero second local-drivers (e.g., no B2 buffers in lcl-drv(n−1), lcl-drvn).

Figure 4:
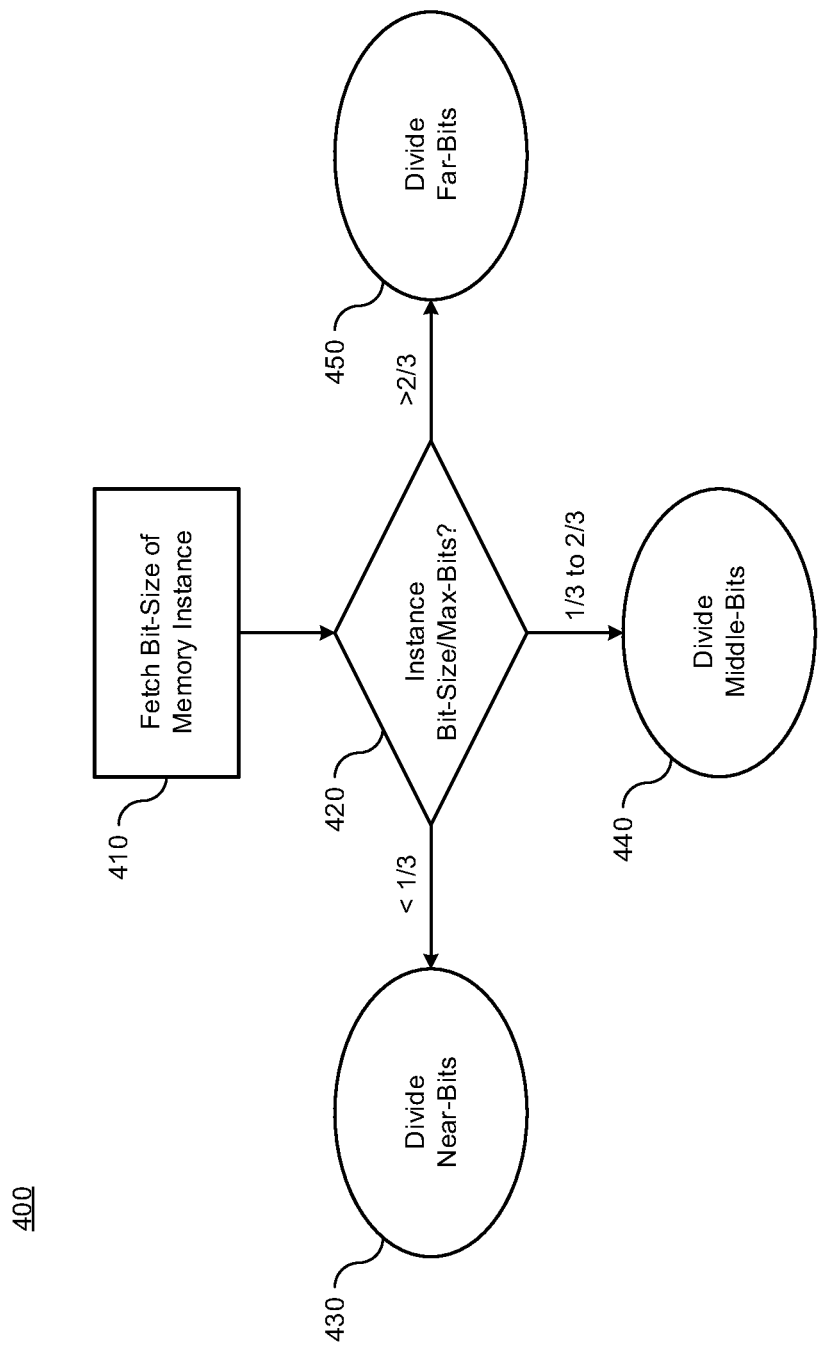
FIGS. 4-7 illustrate various diagrams of methods for providing flexible sizing and routing architecture in accordance with various implementations described herein.
Figure 5:
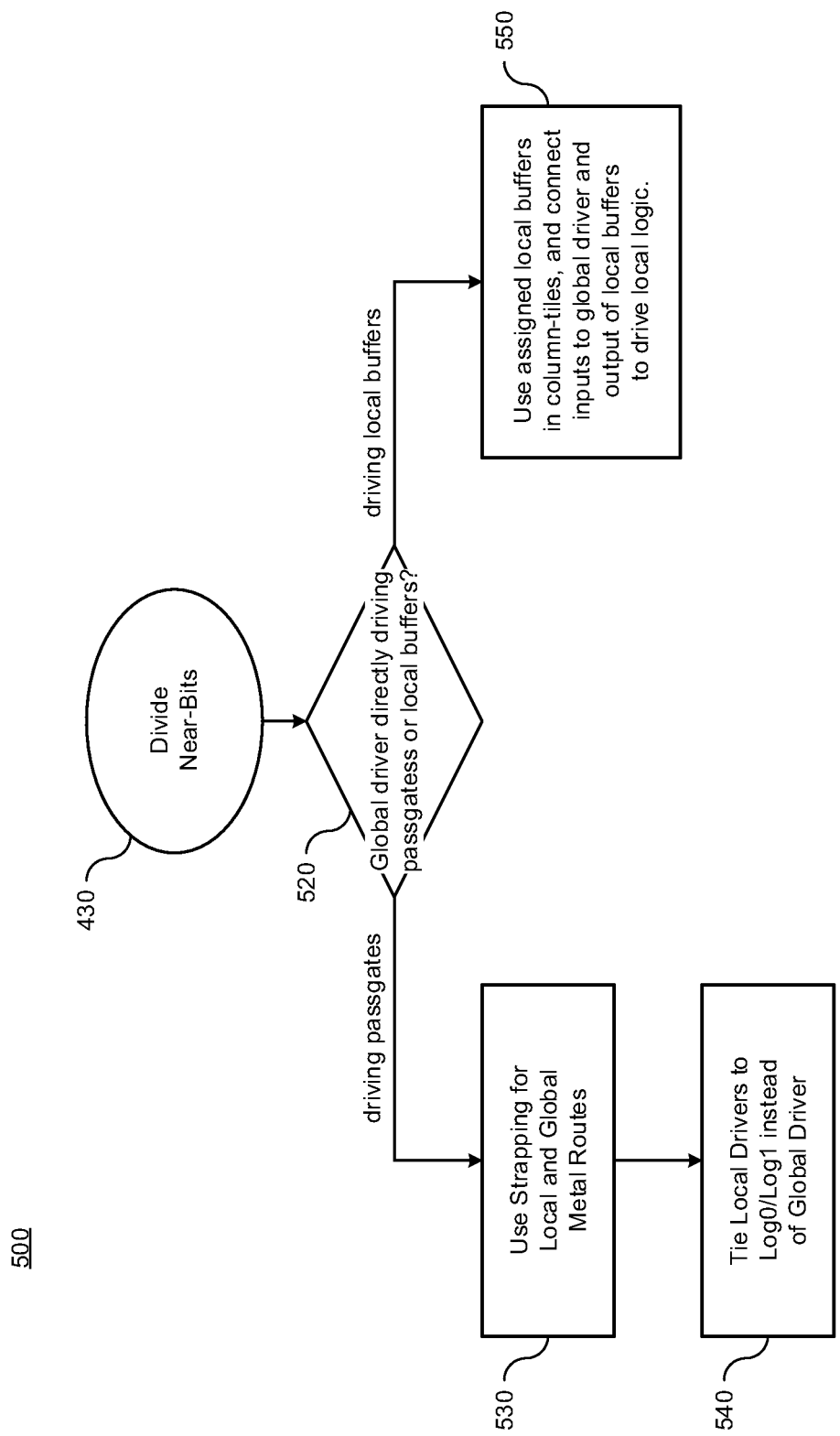
Figure 6:
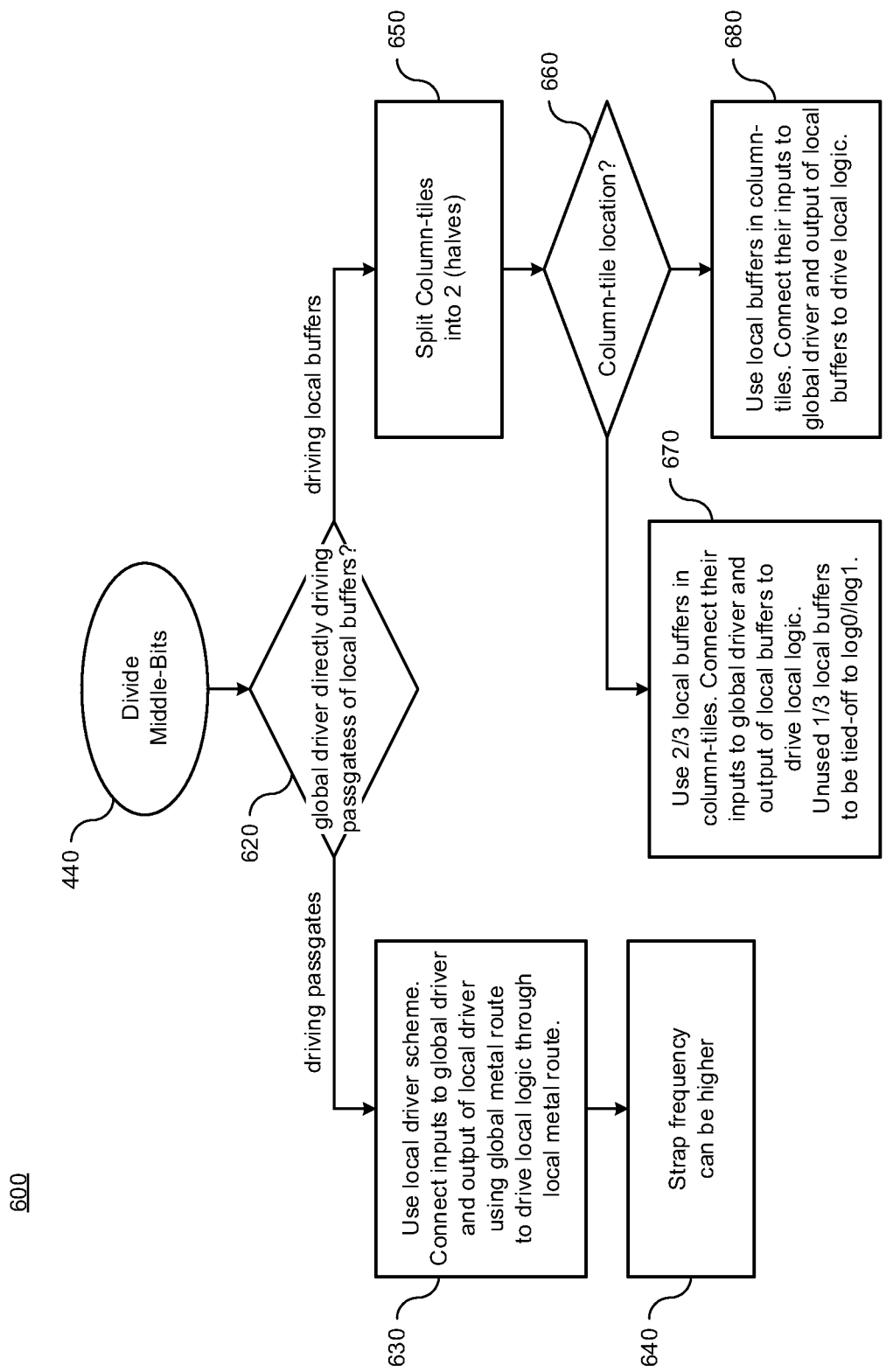
Figure 7:
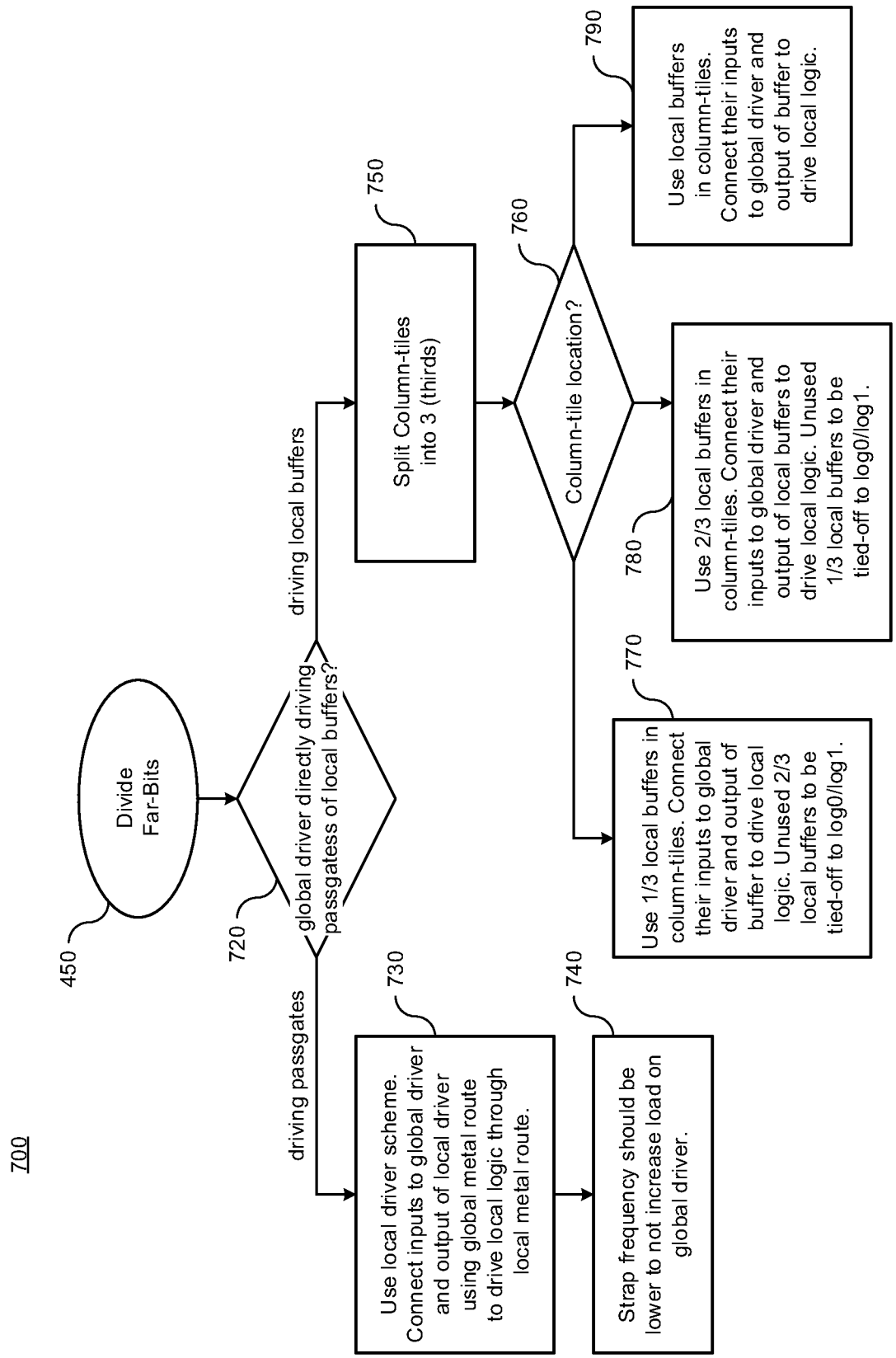

FIGS. 4-7 illustrate various diagrams of methods for providing flexible sizing and routing architecture in accordance with implementations described herein. In particular, as shown, FIG. 4 provides a method 400 for dividing a memory instance into multiple sections, FIG. 5 provides a method 500 for providing a near-bits section, FIG. 6 provides a method 600 for providing a middle-bits section, and FIG. 7 provides a method 700 for providing a far-bits section. FIGS. 4-7 may be utilized in conjunction.

FIG. 4 illustrates a process diagram of method 400 for providing flexible sizing and routing architecture in accordance with various implementations described herein. Also, in various implementations, method 400 may be used to provide the flexible sizing and routing architecture in various configurations, such as, e.g., the first configuration shown in FIG. 1 with reference to a combination of FIGS. 4 and 5, the second configuration shown in FIG. 2 with reference to a combination of FIGS. 4 and 6, and the third configuration shown in FIG. 3 with reference to a combination of FIGS. 4 and 7.

It should be understood that even though method 400 indicates a particular order of operation execution, in some cases, various portions of operations may be executed in a different order, and on different systems. In other cases, additional operations and/or steps may be added to and/or omitted from method 400. Also, method 400 may be implemented in hardware and/or software. For instance, if implemented in hardware, method 400 may be implemented with various components and/or circuitry, as described in FIGS. 1-3. Also, in other instances, if implemented in software, method 400 may be implemented as a program or software instruction process configured to provide flexible sizing and routing architecture, as described herein. Also, if implemented in software, instructions related to implementing method 400 may be stored in memory and/or a database. Also, in some implementations, a computer or various other types of computing devices with a processor and memory may be configured to perform method 400.

As described in reference to FIG. 4, the method 400 may be used for fabricating and/or manufacturing, or causing to be fabricated and/or manufactured, an integrated circuit (IC) that implements various schemes and techniques in physical design as described herein so as to provide flexible sizing and routing architecture using various devices, components and/or circuitry as described herein.

At block 410, method 400 may fetch a bit-size of a memory instance, such as, e.g., a memory macro for a memory block. In various implementations, the memory instance may refer to memory circuitry that is implemented as an integrated circuit (IC) in various types of memory, such as random access memory (RAM), static RAM (SRAM), magneto-resistive RAM (MRAM), and/or any other similar memory. The memory instance may be implemented as an IC with single-port memory architecture and related circuitry, and the memory instance may be integrated with computing circuitry and/or related components on a single chip. The memory instance may be implemented in various embedded systems for various automotive, electronic, computer, mobile and/or Internet of things (IoT) applications. Also, the memory instance may refer to a bitcell array with memory cells (or bitcells) arranged in an array. Also, each bitcell may be configured to store at least one data bit value (e.g., a data value related to a logical '0' or '1'). The bitcell array may also have any number (N) of bitcells arranged in various applicable configurations, such as, e.g., a two-dimensional (2D) memory array having any number of columns (Ncolumns) and any number of rows (Nrows) with the memory cells or bitcells arranged in a 2D grid pattern.

At decision block 420, method 400 may determine a bit-size and/or a number of maximum bits for the memory instance. In some instances, at block 420, method 400 may decide to divide the bit-size of a memory instance into multiple sections including a near-bits section (near), a middle-bits section (middle), and/or a far-bits section (far). For instance, as shown in FIG. 4, at block 430 (and expanded in FIG. 5), method 400 may determine the near-bits section (near) from the memory instance and/or divide a lower one-third ($<1/3$) of the memory instance from the total number of maximum bits as the near-bits section (near). Also, in this instance, as shown in FIG. 4, at block 440 (and expanded in FIG. 6), method 400 may determine the middle-bits section (middle) from the memory instance and/or divide a middle one-third ($1/3$ to $2/3$) of the memory instance from the total number of maximum bits as the middle-bits section (middle). Moreover, in this instance, as shown in FIG. 4, at block 450 (and expanded in FIG. 7), method 400 may determine the far-bits section (far) from the memory instance and/or divide an upper one-third ($>2/3$) of the memory instance from the total number of maximum bits as the far-bits section (far).

In some implementations, method 400 may also provide memory control circuitry with global passgates, a first read-write driver that provides a global read-write signal to the global passgates, and a second read-write driver tied-off to a first voltage. Moreover, method 400 may also provide sense amplifier circuitry with first local-drivers, a sense amplifier driver that provides a sense amplifier enable signal to the first local-drivers, and second local-drivers tied-off to a second voltage that is different than the first voltage.

In some implementations, the first local buffers and the second local buffers are grouped together in columns including a first group in near columns associated with the near-bits section, a second group in middle columns associated with the middle-bits section, and a third group in far columns associated with the far-bits section. In reference to the first group in near columns, the first local-drivers may have a single buffer coupled to the sense amplifier driver, and the second local-drivers have multiple buffers tied-off to the second voltage. Also, in reference to the second group in middle columns, the first local-drivers have two buffers coupled in the parallel to the sense amplifier driver, and the second local-drivers have a single buffer tied-off to the second voltage. Moreover, in reference to the third group in far columns, the first local-drivers have three buffers coupled to the sense amplifier driver, and zero second local-drivers.

In some implementations, the memory instance or memory control circuitry may be provided in a multi-layered structure with a first layer and a second layer that is disposed above the first layer. The global passgates may be disposed in the first layer that is disposed in a lower layer beneath the second layer. The read-write driver may be coupled to the global passgates with a metal line routed in the second layer that is disposed in a higher layer above the first layer. Also, the sense amplifier driver and the local drivers may be disposed in the first layer that is disposed in a lower layer beneath the second layer.

FIG. 5 illustrates a process diagram of method 500 for providing flexible sizing and routing architecture based on determining or dividing the near-bits section (near) from the memory instance in accordance with various implementations described herein. Also, in some implementations, method 500 may be used to provide the flexible sizing and routing architecture in a particular configuration, such as, e.g., the first configuration in a manner as shown in FIG. 1. In reference to FIG. 4, at block 430 (and expanded here in FIG. 5), method 500 may determine the near-bits section (near) from the memory instance and/or divide a lower one-third ($<1/3$) of the memory instance from the total number of maximum bits as the near-bits section (near).

It should be understood that even though method 500 indicates a particular order of operation execution, in some cases, various portions of operations may be executed in a different order, and on different systems. In other cases, additional operations and/or steps may be added to and/or omitted from method 500. Also, method 500 may be implemented in hardware and/or software. For instance, if implemented in hardware, method 500 may be implemented with various components and/or circuitry, as described in FIGS. 1-4. Also, in other instances, if implemented in software, method 500 may be implemented as a program or software instruction process configured to provide flexible sizing and routing architecture, as described herein. Also, if implemented in software, instructions related to implementing method 500 may be stored in memory and/or a database. Also, in some implementations, a computer or various other types of computing devices with a processor and memory may be configured to perform method 500.

As described in reference to FIG. 5, the method 500 may be used for fabricating and/or manufacturing, or causing to be fabricated and/or manufactured, an integrated circuit (IC) that implements various schemes and techniques in physical design as described herein so as to provide flexible sizing and routing architecture using various devices, components and/or circuitry as described herein.

At block 430, method 500 may determine (or identify) the near-bits section (near) from the memory instance and/or divide a lower one-third (<⅓) of the memory instance from the total number of maximum bits as the near-bits section (near). At decision block 520, method 500 may determine whether the global drivers are to directly drive the passgates or the local buffers. If the global drivers are to directly drive the passgates, then at block 530, method 500 may use strapping for local and global metal routes, and then at block 540, method 500 may tie the local drivers to log 0 or log 1 instead of the global driver. Otherwise, if the global drivers are to directly drive the local buffers, then at block 550, method 500 may use assigned local buffers in column tiles and then connect inputs to the global drivers and then use the output of the local buffers to drive the local logic.

FIG. 6 illustrates a process diagram of method 600 for providing flexible sizing and routing architecture based on determining or dividing the middle-bits section (middle) from the memory instance in accordance with various implementations described herein. Also, in some implementations, method 600 may be used to provide the flexible sizing and routing architecture in a particular configuration, such as, e.g., the second configuration in a manner as shown in FIG. 2. In reference to FIG. 4, at block 440 (and expanded here in FIG. 6), method 600 may determine the middle-bits section (middle) from the memory instance and/or divide a middle one-third (⅓ to ⅔) of the memory instance from the total number of maximum bits as the middle-bits section (middle).

It should be understood that even though method 600 indicates a particular order of operation execution, in some cases, various portions of operations may be executed in a different order, and on different systems. In other cases, additional operations and/or steps may be added to and/or omitted from method 600. Also, method 600 may be implemented in hardware and/or software. For instance, if implemented in hardware, method 600 may be implemented with various components and/or circuitry, as described in FIGS. 1-5. Also, in other instances, if implemented in software, method 600 may be implemented as a program or software instruction process configured to provide flexible sizing and routing architecture, as described herein. Also, if implemented in software, instructions related to implementing method 600 may be stored in memory and/or a database. Also, in some implementations, a computer or various other types of computing devices with a processor and memory may be configured to perform method 600.

As described in reference to FIG. 6, the method 600 may be used for fabricating and/or manufacturing, or causing to be fabricated and/or manufactured, an integrated circuit (IC) that implements various schemes and techniques in physical design as described herein so as to provide flexible sizing and routing architecture using various devices, components and/or circuitry as described herein.

At block 440, method 600 may determine (or identify) the middle-bits section (middle) from the memory instance and/or divide a middle one-third (⅓ to ⅔) of the memory instance from the total number of maximum bits as the middle-bits section (middle). Also, at decision block 620, method 600 may determine (or decide) whether the global drivers are to directly drive the passgates or the local buffers. If the global drivers are to directly drive the passgates, then at block 630, method 600 may use the local driver scheme by connecting inputs to the global drivers and the output of the local drivers using global metal routes so as to drive the local logic through the local metal routes. Then, at block 640, method 600 may use a strap frequency that is higher. Otherwise, if the global drivers are to directly drive the local buffers, then at block 650, method 600 may split column tiles into two-halves, and following at decision block 660, method 600 may determine a column tile location. In some instances, at block 670, method 600 may use two-thirds (⅔) of the local buffers in column tiles by connecting their inputs to the global drivers and the outputs of the local buffers to drive the local logic. Also, in some instances, the unused one-third (⅓) of the local buffers may be tied-off to log 0/log 1. In other instances, at block 680, method 600 may use the local buffers in the column-tiles by connecting their inputs to the global drivers and the outputs of the local buffers to drive the local logic.

FIG. 7 illustrates a process diagram of method 700 for providing flexible sizing and routing architecture based on determining or dividing the far-bits section (far) from the memory instance in accordance with various implementations described herein. Also, in some implementations, method 700 may be used to provide the flexible sizing and routing architecture in a particular configuration, such as, e.g., the third configuration in a manner as shown in FIG. 3. In reference to FIG. 4, at block 450 (and expanded here in FIG. 7), method 400 may determine the far-bits section (far) from the memory instance and/or divide an upper one-third (>⅔) of the memory instance from the total number of maximum bits as the far-bits section (far).

It should be understood that even though method 700 indicates a particular order of operation execution, in some cases, various portions of operations may be executed in a different order, and on different systems. In other cases, additional operations and/or steps may be added to and/or omitted from method 700. Also, method 700 may be implemented in hardware and/or software. For instance, if implemented in hardware, method 700 may be implemented with various components and/or circuitry, as described in FIGS. 1-6. Also, in other instances, if implemented in software, method 700 may be implemented as a program or software instruction process configured to provide flexible sizing and routing architecture, as described herein. Also, if implemented in software, instructions related to implementing method 700 may be stored in memory and/or a database. Also, in some implementations, a computer or various other types of computing devices with a processor and memory may be configured to perform method 700.

As described in reference to FIG. 7, the method 700 may be used for fabricating and/or manufacturing, or causing to be fabricated and/or manufactured, an integrated circuit (IC) that implements various schemes and techniques in physical design as described herein so as to provide flexible sizing and routing architecture using various devices, components and/or circuitry as described herein.

At block 450, method 700 may determine the far-bits section (far) from the memory instance and/or divide an upper one-third (>⅔) of the memory instance from the total number of maximum bits as the far-bits section (far). At decision block 720, method 700 may determine (or decide) whether the global drivers are to directly drive the passgates or the local buffers. If the global drivers are to directly drive the passgates, then at block 730, method 700 may use the local driver scheme by connecting inputs to the global drivers and the output of the local drivers using global metal routes so as to drive the local logic through the local metal routes. Then, at block 740, method 700 may use a strap frequency that is lower so as to not increase the load on the global drivers.

Otherwise, if the global drivers are to directly drive the local buffers, then at block 750, method 700 may split column tiles into three-thirds, and following at decision block 760, method 700 may determine a column tile location. In some instances, at block 770, method 700 may use one-third (⅓) of the local buffers in column tiles by connecting their inputs to the global drivers and the outputs of the local buffers to drive the local logic. Also, in some instances, the unused two-thirds (⅔) of the local buffers may be tied-off to log 0/log 1. Also, in some instances, at block 780, method 700 may use two-thirds (⅔) of the local buffers in column tiles by connecting their inputs to the global drivers and the outputs of the local buffers to drive the local logic. Also, in some instances, the unused one-third (⅓) of the local buffers may be tied-off to log 0/log 1. Further, in other instances, at block 790, method 700 may use the local buffers in the column-tiles by connecting their inputs to the global drivers and the outputs of the local buffers to drive the local logic.

In various implementations, in reference to FIGS. 4-7, if the driver from control is directly driving local devices (e.g., write/read passgates) without a local buffer/inverter, then the driver may by configured to drive using a local inverter so as to clean-up the clock-edge that is used to drive the local devices. Some schemes and techniques described herein may be configured to drive the global signal in the higher metal, drive the local inverter/buffer with the lower metal, and vary performance of the local inverter/driver repeat rate. Also, the size of the local driver may be varied based on the instance size. Some schemes and techniques described herein may be configured to reserve multiple local drivers (e.g., 2, 3 or more), and for smaller-bits, the multiple local drivers may be used to improve performance. Otherwise, for medium-sized bits, some of the local drivers (e.g., two of three) may be used to improve the performance and the remaining local drivers are tied to log 0/log 1. Otherwise, for a wider bit-size, a single local driver (e.g., one of three) may be used to improve performance and the remaining local drivers are tied to log 0/log 1. Moreover, an algorithm may be used to find the repeat-rate (e.g., as mentioned above), and local driver size may be tied-off to log 0/log 1 (e.g., as mentioned above) for different memory instance/macro sizes.

It should be intended that the subject matter of the claims not be limited to various implementations and/or illustrations provided herein, but should include any modified forms of those implementations including portions of implementations and combinations of various elements in reference to different implementations in accordance with the claims. It should also be appreciated that in development of any such implementation, as in any engineering or design project, numerous implementation-specific decisions should be made to achieve developers' specific goals, such as, e.g., compliance with system-related constraints and/or business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device with memory control circuitry having global passgates and a read-write driver that provides a global read-write signal to the global passgates. The device may include sense amplifier circuitry having local-drivers and a sense amplifier driver that provides a sense amplifier enable signal to the local-drivers, wherein the local-drivers may have multiple buffers coupled to the sense amplifier driver in parallel.

Described herein are various implementations of a device with memory control circuitry having global passgates and a first read-write driver that provides a global read-write signal to the global passgates. The memory control circuitry may include a second read-write driver tied-off to a first voltage. The device may include sense amplifier circuitry with first local-drivers and a sense amplifier driver that provides a sense amplifier enable signal to the first local-drivers. The sense amplifier circuitry may include second local-drivers tied-off to a second voltage different than the first voltage.

Described herein are various implementations of a method. The method may fetch a bit-size of a memory instance. The method may divide the bit-size of a memory instance into multiple sections including a near-bits section, a middle-bits section and a far-bits section. The method may provide memory control circuitry with global passgates, a first read-write driver that provides a global read-write signal to the global passgates, and a second read-write driver tied-off to a first voltage. The method may provide sense amplifier circuitry with first local-drivers, a sense amplifier driver that provides a sense amplifier enable signal to the first local-drivers, and also second local-drivers tied-off to a second voltage that is different than the first voltage.

Reference has been made in detail to various implementations, examples of which are illustrated in accompanying drawings and figures. In the following detailed description, numerous specific details are set forth to provide a thorough understanding of the disclosure provided herein. However, the disclosure provided herein may be practiced without these specific details. In various implementations, well-known methods, procedures, components, circuits and networks have not been described in detail so as not to unnecessarily obscure details of the embodiments.

It should also be understood that, although various terms first, second, etc. may be used herein to describe various elements, these elements should not be limited by these terms. These terms are only used to distinguish one element from another. For instance, a first element could be termed a second element, and, similarly, a second element could be termed a first element. Also, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and various other similar terms that indicate relative positions above or below a given point or element may be used in connection with various implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, specific features and/or acts described above are disclosed as example forms of implementing the claims.

What is claimed is:

1. A device comprising:
memory control circuitry having global passgates and a read-write driver that provides a global read-write signal to the global passgates; and
sense amplifier circuitry having local-drivers and a sense amplifier driver that provides a sense amplifier enable signal to the local-drivers, wherein the local-drivers include multiple buffers coupled to the sense amplifier driver in parallel.

2. The device of claim 1, wherein:
the global passgates are arranged in columns,
each column of the columns has a global passgate of the global passgates, and
the read-write driver provides the global read-write signal to the global passgate in each column.

3. The device of claim 1, wherein:
the memory control circuitry is provided in a multi-layered structure having a first layer and a second layer that is disposed above the first layer,
the global passgates are disposed in the first layer that is disposed in a lower layer beneath the second layer, and
the read-write driver is coupled to the global passgates with a metal line routed in the second layer that is disposed in a higher layer above the first layer.

4. The device of claim 1, wherein:
the global passgates comprise read-write passgates, and
the read-write driver provides the global read-write signal to the read-write passgates.

5. The device of claim 1, wherein:
the local drivers are arranged in columns,
each column of the columns has a local-driver of the local-drivers, and
the sense amplifier driver provides the sense amplifier enable signal to the local drivers in each column.

6. The device of claim 1, wherein:
the memory control circuitry is provided in a multi-layered structure having a first layer and a second layer that is disposed above the first layer, and
the sense amplifier driver and the local drivers are disposed in the first layer that is disposed in a lower layer beneath the second layer.

7. The device of claim 1, wherein the multiple buffers of the local drivers include two or more buffers coupled to the sense amplifier driver in parallel.

8. The device of claim 1, wherein the multiple buffers of the local drivers include three or more buffers coupled to the sense amplifier driver in parallel.

9. The device of claim 1, wherein the local-drivers are associated with a variable repeat rate that depends on performance of the multiple buffers.

10. The device of claim 1, wherein:
the multiple buffers comprise multiple inverters, and
the local drivers include the multiple inverters coupled to the sense amplifier driver in parallel.

11. A device comprising:
memory control circuitry having global passgates and a first read-write driver that provides a global read-write signal to the global passgates, the memory control circuitry having a second read-write driver tied-off to a first voltage; and
sense amplifier circuitry having first local-drivers and a sense amplifier driver that provides a sense amplifier enable signal to the first local-drivers, the sense amplifier circuitry having second local-drivers tied-off to a second voltage different than the first voltage.

12. The device of claim 11, wherein:
the global passgates and the local drivers are arranged in columns,
each column of the columns has a global passgate of the global passgates and a local-driver of the local-drivers,
the first read-write driver provides the global read-write signal to the global passgates in each column, and
the sense amplifier driver provides the sense amplifier enable signal to the local drivers in each column.

13. The device of claim 11, wherein:
the memory control circuitry is provided in a multi-layered structure having a first layer and a second layer that is disposed above the first layer,
the global passgates are disposed in the first layer that is disposed in a lower layer beneath the second layer,
the read-write driver is coupled to the global passgates with a metal line routed in the second layer that is disposed in a higher layer above the first layer, and
the sense amplifier driver and the local drivers are disposed in the first layer that is disposed in a lower layer beneath the second layer.

14. The device of claim 11, wherein:
the first local drivers have one or more buffers coupled to the sense amplifier driver in parallel, and
the second local-drivers have one or more buffers tied-off to the second voltage.

15. The device of claim 11, wherein:
the first local buffers and the second local buffers are grouped together in columns including a first group in near columns and a second group in far columns,
in the first group in near columns, the first local-drivers have multiple buffers coupled to the sense amplifier driver, and the second local-drivers have at least one buffer tied-off to the second voltage, and
in the second group in far columns, the first local-drivers have three or more buffers coupled to the sense amplifier driver, and zero second local-drivers.

16. The device of claim 11, wherein:
the first local buffers and the second local buffers are grouped together in columns including a first group in near columns, a second group in middle columns and a third group in far columns,
in the first group in near columns, the first local-drivers have a single buffer coupled to the sense amplifier driver, and the second local-drivers have multiple buffers tied-off to the second voltage, in the second group in middle columns, the first local-drivers have two buffers coupled in the parallel to the sense amplifier driver, and the second local-drivers have a single buffer tied-off to the second voltage, and in the third group in far columns, the first local-drivers have three buffers coupled to the sense amplifier driver, and zero second local-drivers.

17. A method comprising:

fetching a bit-size of a memory instance;

dividing the bit-size of a memory instance into multiple sections including a near-bits section, a middle-bits section and a far-bits section;

providing memory control circuitry with global passgates, a first read-write driver that provides a global read-write signal to the global passgates, and a second read-write driver tied-off to a first voltage; and providing sense amplifier circuitry with first local-drivers, a sense amplifier driver that provides a sense amplifier enable signal to the first local-drivers, and second local-drivers tied-off to a second voltage that is different than the first voltage.

18. The method of claim 17, wherein:

the first local buffers and the second local buffers are grouped together in columns including a first group in near columns associated with the near-bits section, a second group in middle columns associated with the middle-bits section, and a third group in far columns associated with the far-bits section.

19. The method of claim 18, wherein:

in the first group in near columns, the first local-drivers have a single buffer coupled to the sense amplifier driver, and the second local-drivers have multiple buffers tied-off to the second voltage, in the second group in middle columns, the first local-drivers have two buffers coupled in the parallel to the sense amplifier driver, and the second local-drivers have a single buffer tied-off to the second voltage, and in the third group in far columns, the first local-drivers have three buffers coupled to the sense amplifier driver, and zero second local-drivers.

20. The method of claim 17, wherein:

the memory control circuitry is provided in a multi-layered structure having a first layer and a second layer that is disposed above the first layer, the global passgates are disposed in the first layer that is disposed in a lower layer beneath the second layer, the read-write driver is coupled to the global passgates with a metal line routed in the second layer that is disposed in a higher layer above the first layer, and the sense amplifier driver and the local drivers are disposed in the first layer that is disposed in a lower layer beneath the second layer.

\* \* \* \* \*